United States Patent [19]

Besson et al.

[11] Patent Number: 5,289,075
[45] Date of Patent: Feb. 22, 1994

[54] RESONATOR FOR A THERMOSTATICALLY-CONTROLLED OSCILLATOR HAVING LOW POWER CONSUMPTION AND RAPID HEATING

[75] Inventors: Raymond J. Besson, Besancon; Serge Galliou, Audeux; Marc Mourey, Besancon, all of France

[73] Assignee: Ecole Nationale Superieure de Mecanique et Des Microtechniques, France

[21] Appl. No.: 33,092

[22] Filed: Mar. 16, 1993

[30] Foreign Application Priority Data

Mar. 17, 1992 [FR] France ............................... 92 03175

[51] Int. Cl.⁵ .................................................. H01L 41/08
[52] U.S. Cl. .................................... 310/367; 310/343; 310/369
[58] Field of Search ............... 310/343, 346, 367, 369, 310/344, 351, 353; 174/52.1

[56] References Cited

U.S. PATENT DOCUMENTS

| | | | |
|---|---|---|---|
| 3,431,392 | 3/1969 | Garland et al. | 310/343 |
| 3,634,787 | 1/1972 | Newell | 310/367 X |
| 4,091,303 | 5/1978 | Takataka et al. | 310/343 |
| 4,221,986 | 9/1980 | Besson | 310/344 |
| 4,334,168 | 6/1982 | Besson et al. | 310/343 |

FOREIGN PATENT DOCUMENTS 44-17194  7/1969  Japan .................... 310/367

*Primary Examiner*—Mark O. Budd
*Attorney, Agent, or Firm*—Lawrence M. Nawrocki

[57] ABSTRACT

The present invention relates to a piezoelectric resonator having adherent or non-adherent electrodes, the piezoelectric crystal comprising a central portion and a peripheral portion forming a ring that surrounds the central portion and that is connected thereto by an intermediate portion in which a slot is formed, the peripheral portion being connected to the central portion by a single connection bridge constituted by a non-slotted portion of said intermediate portion that extends over a small fraction of the periphery of said intermediate portion. The central portion constitutes the active vibrating portion of the crystal and the peripheral portion is held in the box by fastening means disposed in such a manner as to be thermally as remote as possible from the single connection bridge. The secured portion and the bridge constitute means for suspending the crystal.

12 Claims, 5 Drawing Sheets

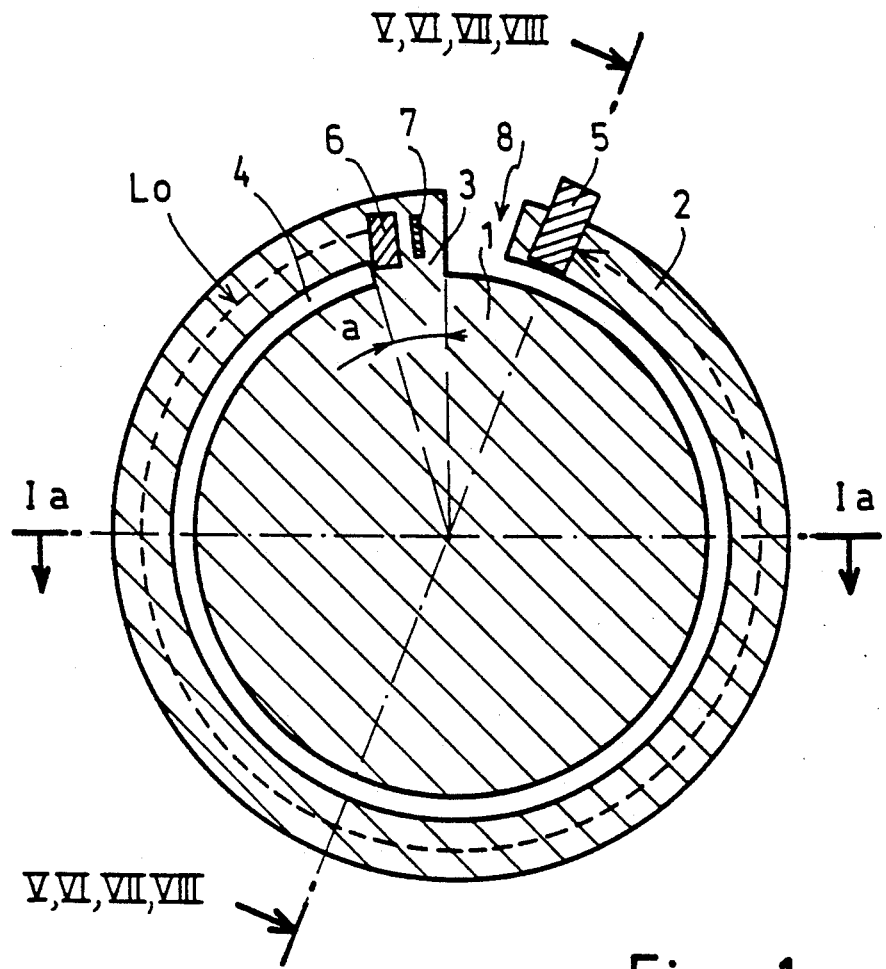
Fig_1
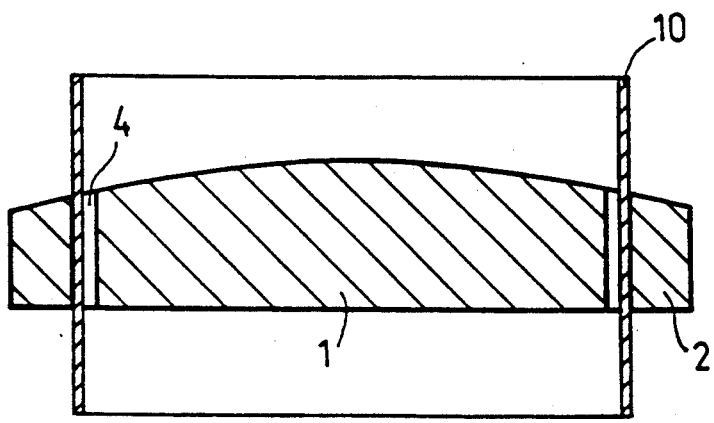
Fig_1a

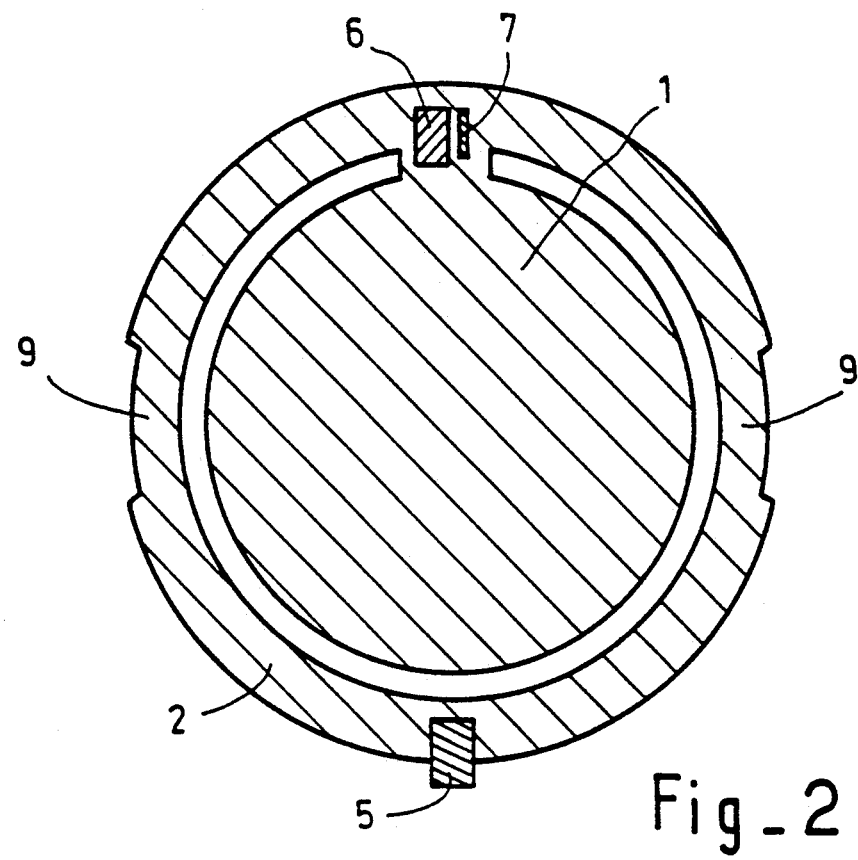
Fig_2
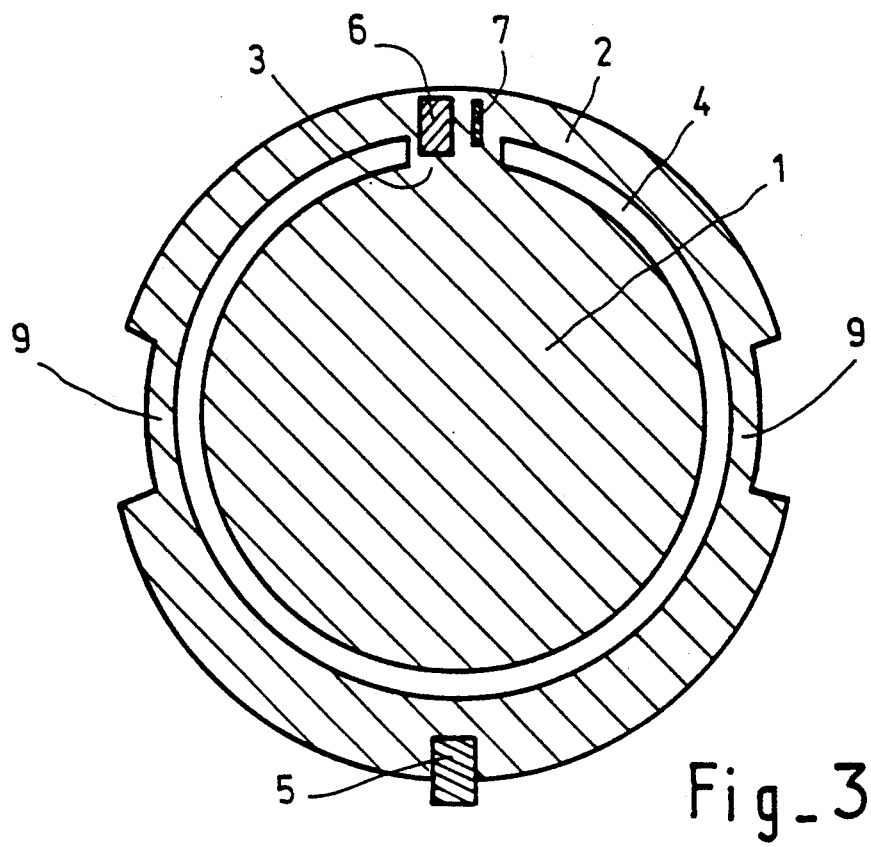
Fig_3

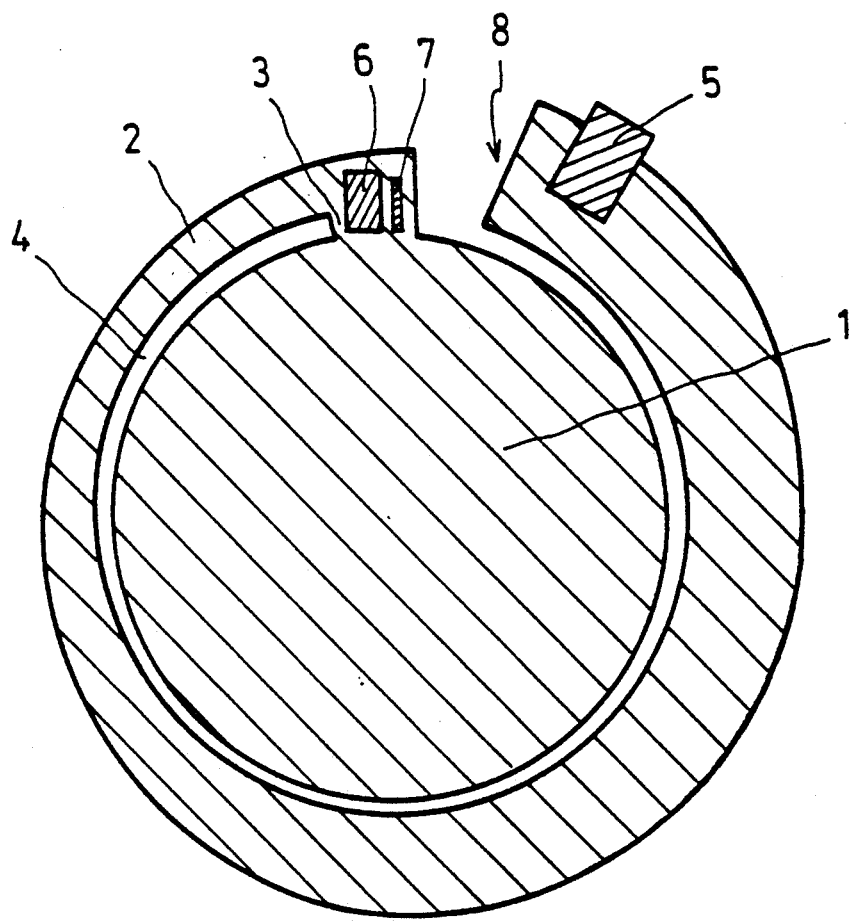
Fig_4

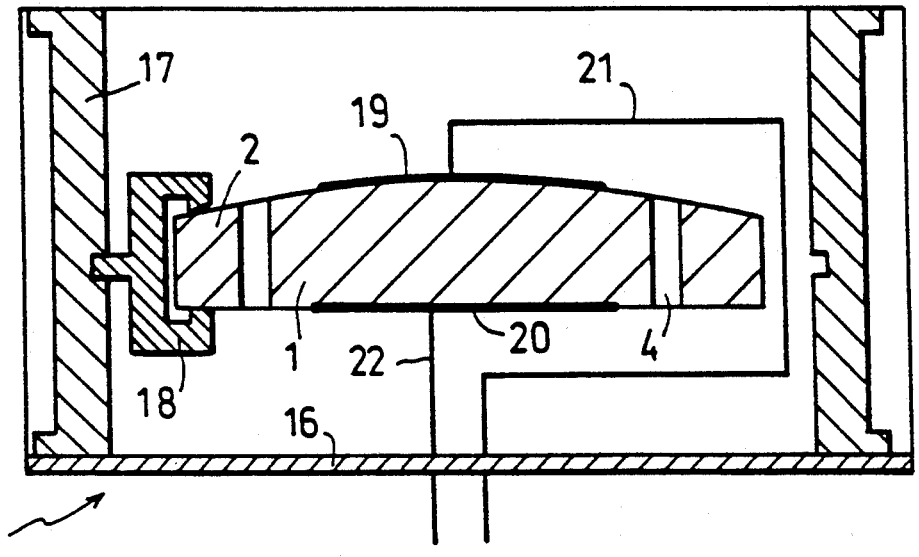
Fig_5
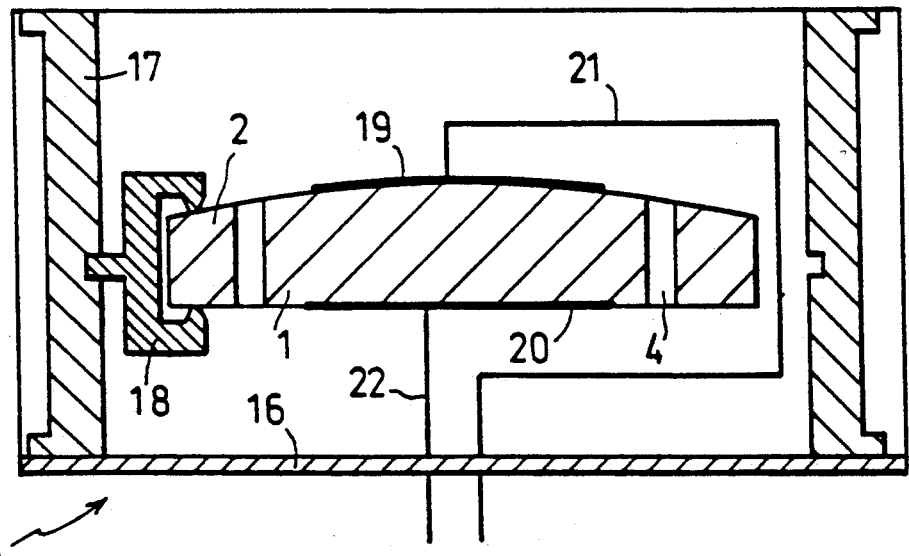
Fig_6

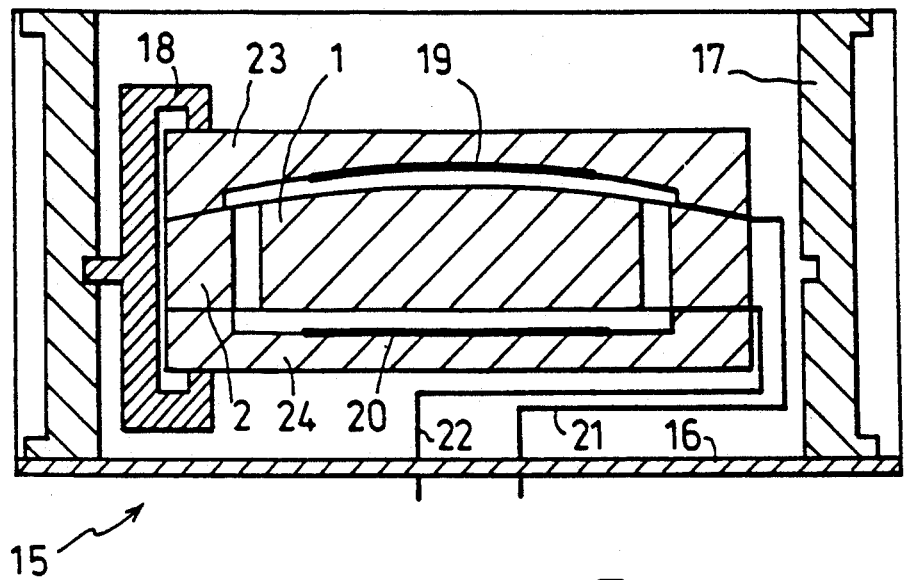
Fig_7
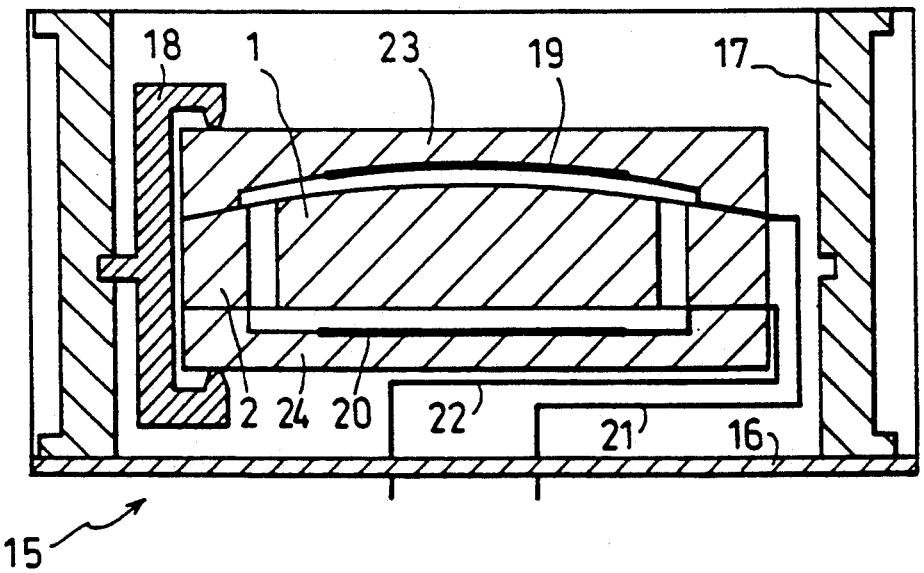
Fig_8

RESONATOR FOR A THERMOSTATICALLY-CONTROLLED OSCILLATOR HAVING LOW POWER CONSUMPTION AND RAPID HEATING

BACKGROUND OF THE INVENTION

Various kinds of piezoelectric resonator are known.

In a conventional first example, a resonator crystal is constituted by a bi-planar, planar-convex, or bi-convex quartz slab of circular outline, with metal electrodes referred to as "adherent" electrodes deposited directly on the main faces thereof.

In another embodiment, the quartz slab with adherent electrodes is externally delimited by a ring of quartz serving as a support for the resonator crystal.

In yet another embodiment, the resonator crystal is connected to a ring of quartz via bridges cut-out in a solid crystal. The electrodes may be adherent or non-adherent. When non-adherent, the electrodes are deposited on quartz slabs having the same cut as the crystal and a similar shape, and only the rings of the electrode-supporting slabs come into contact with the ring of the vibrating crystal.

In this disposition where the crystal is self-suspended without any metal diffusion, thermal compression, or fixing means associated with the active portion of the crystal, it is possible to obtain excellent frequency stability and also better resistance to shock.

However, such frequency stability requires accurate temperature control and the slightest fluctuation in temperature has an effect on the frequency of oscillation of the resonator crystal. That is why it is usual for the resonator to be placed in a very high accuracy thermostat for limiting such fluctuations, but which unfortunately consumes a non-negligible amount of power.

OBJECT AND SUMMARY OF THE INVENTION

Thus, at present, no thermostatically-controlled oscillator is available having a power consumption of less than 100 mW and that is also capable of reliably providing a frequency that is accurate to within $10^{-9}$ and of doing so within less than 4 minutes.

Unfortunately, the need for such an oscillator is manifest in the fields mentioned at the beginning of the description.

The present invention therefore provides a piezoelectric resonator having a crystal with adherent or non-adherent electrodes, the resonator being of the type comprising a sealed box containing at least one piezoelectric crystal interposed between first and second electrodes that are connected respectively to first and second conductors extending outside the box, and fastening means for fastening the piezoelectric crystal inside the box, the piezoelectric crystal comprising a central portion and a peripheral portion forming a ring that surrounds the central portion at a distance therefrom and that is connected thereto by an intermediate portion that is narrow in the radial direction and in which a slot is formed, wherein the peripheral portion is connected to the central portion via a single connection bridge constituted by a non-slotted portion of said intermediate portion extending over a small fraction of the periphery of said intermediate portion, and wherein the central portion constitutes the active vibration portion of the crystal while the peripheral portion is secured in the box by the fastening means which is disposed in such a manner as to be thermally as remote as possible from the single connection bridge, said secured portion and said bridge constituting means for suspending the crystal.

This embodiment with a single connection bridge is remarkable in that it channels conduction heat flows, thereby providing considerably improved control over the temperature of the resonator.

The resonator includes a heater element placed as close as possible to the vibrating central portion in the peripheral portion extending the single connection bridge, and a temperature sensor disposed adjacent to said heater element, and means are provided for regulating the electrical power applied to the heater element as a function of the temperature measured by the temperature sensor in order to ensure a constant temperature for the piezoelectric crystal.

In a first embodiment, the ring-forming peripheral portion is interrupted to form a gap having one of its walls extending one of the lateral sides of the single connection bridge, the other wall of the gap defining a free end to which the fastening means is fastened, such that the fastening means is thermally as remote as possible from the single connection bridge that receives the heater element and the temperature sensor.

According to a particular feature, the width of the ring-forming peripheral portion varies continuously from a minimum width at the connection bridge to a maximum width at its free end where the fastening element is located, the width of the intermediate slot remaining constant.

In a second embodiment, the fastening means for fastening the crystal to the box is placed level with a region of the peripheral portion situated opposite to the single connection bridge relative to the active central portion, and thermal constrictions are placed symmetrically in the peripheral portion on either side of the central portion such that the fastening means is thermally as remote as possible from the heater element and the temperature sensor.

Preferably, said thermal constrictions are formed in a direction perpendicular to the radial direction defined by the axis of symmetry of the single connection bridge.

According to a particular feature, the ring-forming peripheral portion has at least two different widths, a first width for a first portion of said ring extending between the single connection bridge and the thermal constrictions, and a second width for a second portion extending between said thermal constrictions and the fastening means, the width of the intermediate slot remaining constant.

DESCRIPTION OF THE DRAWINGS

Other features and advantages of the present invention appear more clearly on reading the following description made with reference to the accompanying drawings, in which:

FIG. 1 is a plan view of a resonator of the invention in which the outer ring is interrupted;

FIG. 1a is a section on line Ia—Ia of FIG. 1 showing how a reflector screen is implemented;

FIG. 2 shows another configuration of a resonator of the invention having an uninterrupted outer ring;

FIG. 3 shows a configuration analogous to that of FIG. 2, in which the outer ring is of varying width in the radial direction;

FIG. 4 shows a configuration analogous to that of FIG. 1 in which the outer ring is of varying width in the radial direction;

FIGS. 5 and 6 show two variant embodiments of configurations having adherent electrodes, with the resonator being mounted as shown in FIG. 1, the figures being sections in the plane V, VI, VII, VIII-V, VI, VII, VIII and passing through the support of the resonator; and FIGS. 7 and 8 show two variant embodiments of configurations having non-adherent electrodes, with the resonator being mounted as shown in FIG. 1, the figures being sections in the plane V, VI, VII, VIII-V, VI, VII, VIII and passing through the support of the resonator.

MORE DETAILED DESCRIPTION

FIGS. 1 and 2 are two plan views and a section view through two embodiments of a resonator of the invention.

A resonator is conventionally in the form of a slab of quartz or any other analogous piezoelectrical material which is generally circular in outline.

In accordance with the invention, the slab has a through hole running around a circular outline to form a ring-shaped slot except at a special place. A disk is thus obtained having a central portion 1 connected to a ring-shaped peripheral portion 2 via a single connecting bridge 3 disposed in an intermediate zone 4 of small extent in the radial direction. The hole is made in simple and conventional manner by ultrasonic machining, for example, and the connection bridge is advantageously made without forming any discontinuity in the thickness between the central portion 1 and the peripheral portion 2. The width of the single connection bridge 3 constitutes a small fraction of the intermediate zone 4 and in general it does not exceed five-hundredths of the length of the mean curve of the intermediate zone. The bridge cannot be placed arbitrarily, and the quality of the resonator is particularly good if the single bridge 3 is placed in a direction that corresponds to an absolute or a relative minimum or maximum in the Young's modulus of the crystal.

The central portion 1 of the crystal constitutes its active portion and it may either be fitted with electrodes on each of its main faces, or else it may cooperate with independent electrodes deposited on disks or trays disposed facing each of its main faces.

The peripheral portion 2 which constitutes a support portion for the resonator is fixed to the box by fixing means 5, e.g. in the form of a clamp. Advantageously, said peripheral portion 2 may be used as a substrate for electronic circuits such as oscillators or stabilizers, for example.

As is known, the piezoelectric crystal of a resonator for use as a frequency reference must be raised to its inversion temperature and must be accurately maintained at said temperature, which temperature is greater than ambient, in order to ensure that the stability of the system over time is as good as possible.

According to the invention, this temperature is reached, and above all is maintained, essentially by internal heating of the active portion 1 of the crystal of the resonator. To do this, a heater element 6 is placed very close to the vibrating central portion 1 of the resonator, level with the peripheral portion 2 that extends the single connecting bridge 3. A temperature sensor 7 placed adjacent to said heater element 6 and thus also as close as possible to the vibrating portion 1, i.e. at the connecting bridge 3, serves to measure the temperature reached by the crystal.

A regulation loop (not shown but which can be implemented by the person skilled in the art using conventional techniques), ensures that the crystal is at a constant temperature by adjusting the electrical power fed to the heater element 6 as a function of the temperature measured by the temperature sensor or probe 7.

In a first embodiment, as shown in FIG. 1, the ring-shaped peripheral portion 2 is open over a gap that may be about as wide as the single connecting bridge 3, with one of the walls of the gap 8 formed in this way coinciding with one of the sides of the connection bridge 3, while its other wall defines the free end of the ring 2 that is interrupted in this way. A heat path LO is thus established between the heater element 6 and the fastening means 5 located at said free end, with the length of said path being substantially the same as the length of the mean curve of the peripheral portion 2, and presents a high level of heat resistance, such that said path necessarily and surprisingly channels the conduction heat flux developed in the vibrating portion 1 of the crystal. This maximum separation between the fastening means 5 and the heater element 6 due to the length of the ring 2 makes it possible to provide better temperature control of the resonator with said ring simultaneously providing good thermal insulation between the resonator and the outside.

As shown in FIG. 1a, for example, installing a reflective screen, e.g. level with the outside surfaces of the disks or trays receiving the independent electrodes if the resonator is of the type having non-adherent electrodes, or else placed directly on the peripheral portion 2 if the resonator is of the type having adherent electrodes, may also serve to reduce or even eliminate heat exchange by radiation that would otherwise exist between the resonator and the box in which it is located in a vacuum. In the latter case, it can be seen that the reflective screen or mirror 10 is attached to the inside face of the peripheral portion 2 facing the central portion 1.

The time required for frequency stabilization is mainly linked to the thermal resistance of the resonator which corresponds to a time constant specific thereto which can be calculated and measured.

In particular, the thermal resistance $R_R$ depends on the angle a (related to the diameter d of the vibrating portion 1 of the crystal and to the width L of the bridge by the equation $\frac{1}{2}d.\sin a = L$) in compliance with the following equation:

$$R_R = (1/\lambda e)[\pi - \frac{1}{2}a](K/W)$$

where $\lambda$ is the conductivity of the quartz in the bridge direction and e is the thickness of the quartz. By applying this equation, it can easily be seen that the thermal resistance, e.g. of a partial 3 SC cut 10 MHz resonator may lie in the range 630 K/W to 140 K/W, with the time constant of such a resonator lying in the range 12 s to 60 s. The ring 2 provides good thermal insulation between the bridge 3 and the fastening means 5 since its thermal resistance is of the order of 5,000 K/W, thereby implying that very low heating power is required.

Tests have shown that frequency stability can be obtained after 3 minutes with such a device when using a heating power of about 30 mW.

In a second embodiment as shown in FIG. 2, in order to retain a certain amount of resonator symmetry, and thus retain low sensitivity to accelerations, the ring 2 is not interrupted but is complete, but the fixing means 5 of the ring 2 is now placed opposite to the heater element 6 and the temperature probe 7. In order to ensure that the thermal resistance between the heater element 6 and the fixing means 5 remains as high as possible, thermal constrictions 9 are formed symmetrically in the ring 2 on either side of the active vibrating central portion 1, and preferably in a direction perpendicular to the radial direction defined by the axis of symmetry of the single connection bridge 3.

As shown in FIGS. 3 and 4, it should be observed that the ring 2 may be non-uniform in width.

Thus, in the embodiment of FIG. 3, which is an embodiment of the type having a ring 2 that is complete, the ring has two distinct widths, its first width corresponding to the portion of the ring that lies between the connection bridge 3 and the symmetrical thermal constrictions 9, while the second width corresponds to the portion of the ring extending between the constrictions 9 and the fixing means 5. Nevertheless, the width of the intermediate zone 4 remains constant.

In the embodiment of FIG. 4, which is of the type having a ring 2 that is interrupted, the width of the ring varies continuously from a minimum width level with the connection bridge 3 and thus with the heater element 6 and the temperature probe 7 to a maximum width level with its free end to which the fastening means 5 is fixed, the central portion 1 being of constant diameter. The intermediate zone 4 is likewise of constant width that is small in the radial direction.

FIGS. 5 to 8 show how the resonator of the invention is placed in its box, both for an adherent electrode configuration and for a non-adherent electrode configuration.

In FIGS. 5 and 6, the box has a base support 16 on which a vertical wall 17 stands, e.g. a cylindrical wall, which wall receives a clamp 18 that holds the peripheral portion 2 of the resonator. The electrodes 19 and 20 adhering to the active portion of the crystal 1 are connected by connection wires 21 and 22 to electronic circuits (not shown) for processing signals, which circuits may be located outside the box 15. However, the peripheral portion 2 of the resonator may itself be used as a substrate for the electronic circuits that are associated with the resonator.

FIGS. 7 and 8 show a non-adherent electrode configuration where the electrodes 19 and 20 are held in place facing the active portion of the crystal 1 by a top portion 23 and a bottom portion 24 that overlie the resonator and that bear against its peripheral portion 2. As in the preceding embodiment, connection wires 21 and 22 serve to connect these electrodes to electronic circuits that may be located outside the box 1. In FIGS. 7 and 8, the clamp 18 holding the resonator is no longer in direct contact with the peripheral portion 2, but is in contact with the outer faces of the top and bottom portions 23 and 24, and said contact may either be plane (FIGS. 5 and 7) or pointed (FIGS. 6 and 8).

We claim:

1. A piezoelectric resonator having a crystal with adherent or non-adherent electrodes, the resonator being of the type comprising a sealed box containing at least one piezoelectric crystal interposed between first and second electrodes that are connected respectively to first and second conductors extending outside the box, and fastening means for fastening the piezoelectric crystal inside the box, the piezoelectric crystal comprising a central portion and a peripheral portion forming a ring that surrounds the central portion at a distance therefrom and that is connected thereto by an intermediate portion that is narrow in the radial direction and in which a slot is formed, wherein the peripheral portion is connected to the central portion via a single connection bridge constituted by a non-slotted portion of said intermediate portion extending over a small fraction of the periphery of said intermediate portion, and wherein the central portion constitutes the active vibration portion of the crystal while the peripheral portion is secured in the box by the fastening means which is disposed in such a manner as to be thermally as remote as possible from the single connection bridge, said secured portion and said bridge constituting means for suspending the crystal.

2. A resonator according to claim 1, including a heater element placed as close as possible to the vibrating central portion in the peripheral portion extending the single connection bridge, and a temperature sensor disposed adjacent to said heater element, and wherein means are provided for regulating the electrical power applied to the heater element as a function of the temperature measured by the temperature sensor in order to ensure a constant temperature for the piezoelectric crystal.

3. A resonator according to claim 1, wherein the ring-forming peripheral portion is interrupted to form a gap having one of its walls extending one of the lateral sides of the single connection bridge, the other wall of the gap defining a free end to which the fastening means is fastened, such that the fastening means is thermally as remote as possible from the single connection bridge that receives the heater element and the temperature sensor.

4. A resonator according to claim 3, wherein the width of the ring-forming peripheral portion varies continuously from a minimum width at the connection bridge to a maximum width at its free end where the fastening element is located, the width of the intermediate slot remaining constant.

5. A resonator according to claim 1, wherein the fastening means for fastening the crystal to the box is placed level with a region of the peripheral portion situated opposite to the single connection bridge relative to the active central portion, and wherein thermal constrictions are placed symmetrically in the peripheral portion on either side of the central portion such that the fastening means is thermally as remote as possible from the heater element and the temperature sensor.

6. A resonator according to claim 5, wherein said thermal constrictions are formed in a direction perpendicular to the radial direction defined by the axis of symmetry of the single connection bridge.

7. A resonator according to claim 6, wherein the ring-forming peripheral portion has at least two different widths, a first width for a first portion of said ring extending between the single connection bridge and the thermal constrictions, and a second width for a second portion extending between said thermal constrictions and the fastening means, the width of the intermediate slot remaining constant.

8. A resonator according to claim 1, wherein the single connection bridge is disposed in a direction that corresponds to an absolute or a relative minimum or maximum of Young's modulus for the crystal.

9. A resonator according to claim 1, wherein the peripheral portion is covered by a reflective screen placed on its inside face facing the central portion so as to reduce the radiation emitted by the crystal.

10. A resonator according to claim 1, wherein the resonator is disposed in an atmosphere whose temperature is much less than the inversion temperature of the piezoelectric crystal.

11. A resonator according to claim 1, wherein the peripheral portion is used as a substrate for electronic circuits associated with the resonator, such as oscillator circuits or stabilizing amplifier circuits.

12. Use of the resonator according to claim 1, as a thermostatically-controlled oscillator having low power consumption and rapid heating.

* * * * *